United States Patent
You

(10) Patent No.: US 12,464,918 B2
(45) Date of Patent: Nov. 4, 2025

(54) DISPLAY DEVICE

(71) Applicant: Samsung Display Co., Ltd., Yongin-si (KR)

(72) Inventor: Chungi You, Asan-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 513 days.

(21) Appl. No.: 18/149,890

(22) Filed: Jan. 4, 2023

(65) Prior Publication Data

US 2023/0232687 A1 Jul. 20, 2023

(30) Foreign Application Priority Data

Jan. 5, 2022 (KR) .................. 10-2022-0001654

(51) Int. Cl.
*H10K 59/131* (2023.01)
*H10D 86/40* (2025.01)
*H10K 59/121* (2023.01)
*H10K 59/122* (2023.01)
*H10K 71/00* (2023.01)

(52) U.S. Cl.
CPC .................. *H10K 59/1315* (2023.02)

(58) Field of Classification Search
CPC ............ H10K 59/131; H10K 59/1315; H10K 59/121; H10K 59/122; H10K 71/861; H10D 86/451; H10D 86/60; H10D 86/441

See application file for complete search history.

(56) References Cited

U.S. PATENT DOCUMENTS

| | | | |
|---|---|---|---|
| 2020/0135089 A1* | 4/2020 | Ji | H10H 29/142 |
| 2020/0342815 A1* | 10/2020 | Kim | G09G 3/3291 |
| 2021/0057506 A1* | 2/2021 | Jo | G09G 3/3233 |
| 2021/0210020 A1* | 7/2021 | Cho | G09G 3/3266 |
| 2022/0320227 A1* | 10/2022 | Gao | H10D 86/00 |
| 2023/0376142 A1* | 11/2023 | Mitsui | G06F 3/0412 |

FOREIGN PATENT DOCUMENTS

| | | |
|---|---|---|
| KR | 1020070082815 A | 8/2007 |
| KR | 1020200004932 A | 1/2020 |
| KR | 1020210014233 A | 2/2021 |
| KR | 1020210035357 A | 4/2021 |

* cited by examiner

*Primary Examiner* — Mohsen Ahmadi
(74) *Attorney, Agent, or Firm* — CANTOR COLBURN LLP

(57) ABSTRACT

A display device includes a base substrate, an active layer disposed on the base substrate, a first conductive layer disposed on the active layer, where the first conductive layer includes a plurality of wires, a second conductive layer disposed on the active layer, where second conductive layer includes a first pattern covering each of the plurality of wires and a second pattern spaced apart from the first pattern, and a third conductive layer disposed on the second conductive layer. At least a portion of the third conductive layer electrically contacts the second pattern.

19 Claims, 14 Drawing Sheets

DISPLAY DEVICE

This application claims priority to Korean Patent Application No. 10-2022-0001654, filed on Jan. 5, 2022, and all the benefits accruing therefrom under 35 U.S.C. § 119, the content of which in its entirety is herein incorporated by reference.

BACKGROUND

1. Field

Embodiments of the invention relate generally to a display device with a relatively low resistance.

2. Discussion of the Related Art

A display device may display an image. The display device may include a wire and an electrode including a conductive material. If a resistance of the wire and a resistance of the electrode is relatively large, a display performance of the display device may be deteriorated.

Manufacturing process of the display device may include etching a conductive layer and an insulation layer using masks. As the number of masks used in the manufacturing process increases, a yield of the manufacturing process may decrease.

SUMMARY

Embodiments provide a display device with improved display performance.

An embodiment of a display device according to the invention includes a base substrate, an active layer disposed on the base substrate, a first conductive layer disposed on the active layer, where the first conductive layer includes a plurality of wires, a second conductive layer disposed on the active layer, where the second conductive layer includes a first pattern covering each of the plurality of wires and a second pattern spaced apart from the first pattern, and a third conductive layer disposed on the second conductive layer. In such an embodiment, at least a portion of the third conductive layer may electrically contact the second pattern.

According to an embodiment, the first pattern may directly contact an upper surface and a side surface of each of the plurality of wires.

According to an embodiment, the second pattern may include a horizontal signal line extending in a first direction.

According to an embodiment, the third conductive layer may include a vertical signal line extending in a second direction crossing the first direction, and electrically contacting the horizontal signal line.

According to an embodiment, the second pattern may further include a driving gate electrode. In such an embodiment, at least a portion of the driving gate electrode may overlap the active layer.

According to an embodiment, at least a portion of the vertical signal line may overlap the driving gate electrode, and the portion of the vertical signal line and the driving gate electrode may define a capacitor.

According to an embodiment, the display device may further include a repair line extending in a first direction, where the repair line may be electrically insulated from the active layer, the first conductive layer, the second conductive layer and the third conductive layer.

According to an embodiment, the repair line may be disposed in a same layer as the first conductive layer.

According to an embodiment, the repair line may include a same material as the second conductive layer.

According to an embodiment, the second pattern may be disposed in a same layer as the first conductive layer.

According to an embodiment, the first conductive layer may include a first metal layer including titanium and a second metal layer disposed on the first metal layer and including aluminum, and the second conductive layer may include molybdenum.

According to an embodiment, the second pattern may further include a first pad electrode, and the third conductive layer may further include a second pad electrode disposed on the first pad electrode and electrically contacting the first pad electrode.

According to an embodiment, the display device may further include a pixel electrode disposed on the third conductive layer and electrically contacting the third conductive layer, and a pixel defining layer disposed on the pixel electrode, where an opening may be defined in the pixel defining layer to expose at least a portion of the pixel electrode.

An embodiment of a display device according to the invention includes a base substrate, a first conductive layer disposed on the active layer, where the first conductive layer includes a plurality of wires and a first driving gate electrode, and at least a portion of the first driving gate electrode overlaps the active layer, a second conductive layer disposed on the active layer, where the second conductive layer includes a first pattern covering each of the plurality of wires, a second pattern spaced apart from the first pattern, and a second driving gate electrode covering the first driving gate electrode, and a third conductive layer disposed on the second conductive layer. In such an embodiment, at least a portion of the third conductive layer may electrically contact the second pattern.

According to an embodiment, the second pattern may include a horizontal signal line extending in a first direction.

According to an embodiment, the third conductive layer may include a vertical signal line extending in a second direction crossing the first direction and electrically contacting the horizontal signal line.

According to an embodiment, at least a portion of the vertical signal line may overlap the second driving gate electrode, and the portion of the vertical signal line and the driving gate electrode may define a capacitor.

According to an embodiment, the display device may further include a repair line extending in a first direction, where the repair line may be electrically insulated from the active layer, the first conductive layer, the second conductive layer and the third conductive layer.

According to an embodiment, the repair line may be disposed in a same layer as the first conductive layer.

According to an embodiment, the repair line may include a same material as the second conductive layer.

In embodiments of the invention, a display device may include a first conductive layer including a plurality of wires and a second conductive layer including a first pattern covering the plurality of wires. Accordingly, a resistance of each of the plurality of wires may be relatively low, and thus, display performance of the display device may be improved.

BRIEF DESCRIPTION OF THE DRAWINGS

The accompanying drawings, which are included to provide a further understanding of the invention and are incorporated in and constitute a part of this specification, illustrate embodiments of the invention together with the description.

DETAILED DESCRIPTION

Figure 1:
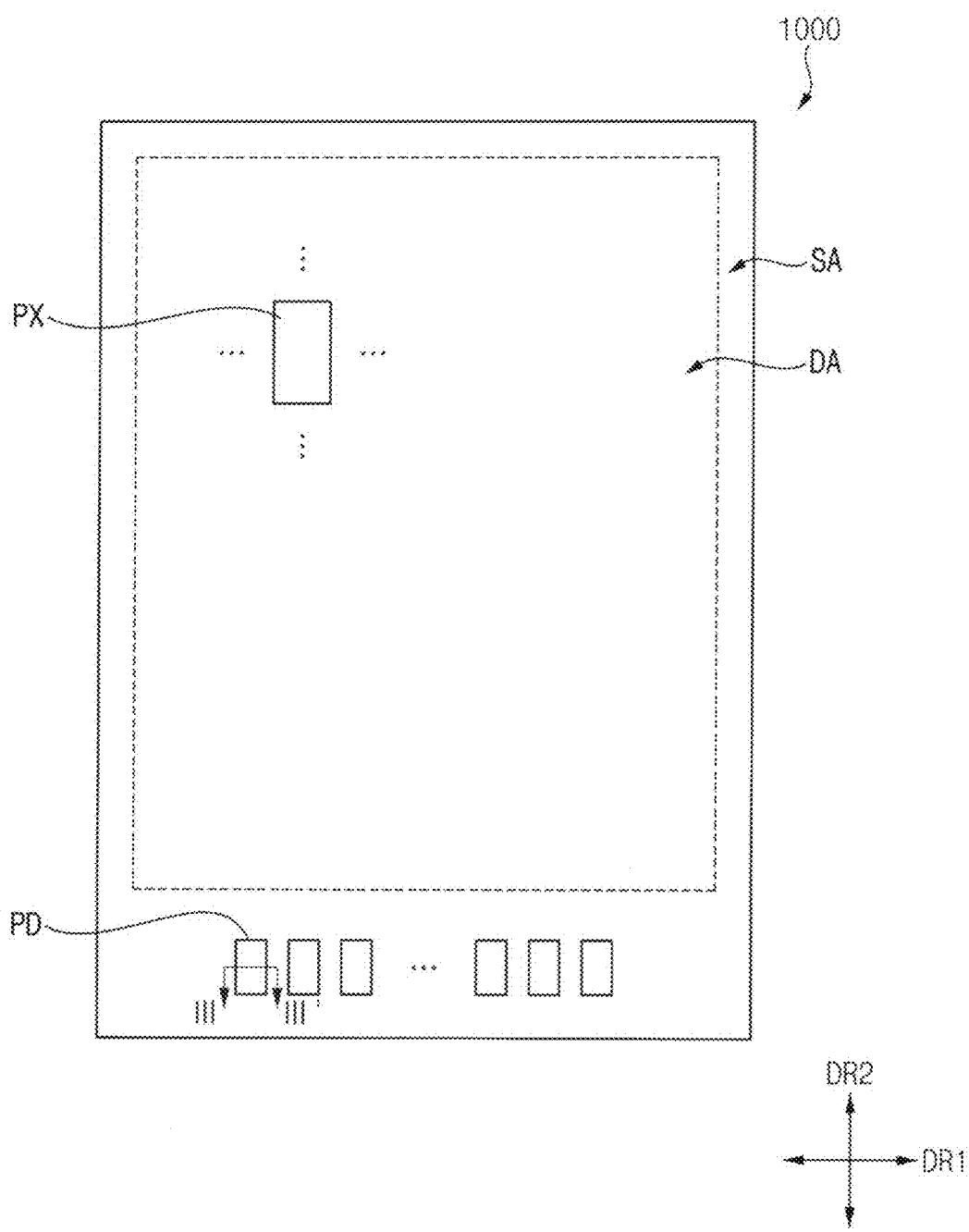
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

FIG. 1 is a plan view illustrating a display device according to an embodiment.

Referring to FIG. 1, an embodiment of a display device 1000 may include a display area DA and a peripheral area SA.

The display area DA may be an area in which an image is displayed. In such an embodiment, a pixel PX may be disposed in the display area DA to display the image. The pixel PX may receive an electrical signal and may emit light having a luminance corresponding to intensity of the electrical signal. In an embodiment, the pixel PX may include a plurality of pixels arranged in a matrix form in a first direction DR1, and a second direction DR2 crossing the first direction DR1.

The peripheral area SA may surround at least a portion of the display area DA. In an embodiment, as shown in FIG. 1, the peripheral area SA may surround the display area DA. A driving part for generating or transmitting the electrical signal may be disposed in the peripheral area SA. In such an embodiment, a pad PD may be disposed in the peripheral area SA. The pad PD may be electrically connected to the pixel PX. In such an embodiment, the pad PD may be electrically connected to a driving chip. In an embodiment, the pad PD may include a plurality of pads arranged in the first direction DR1.

Figure 2:
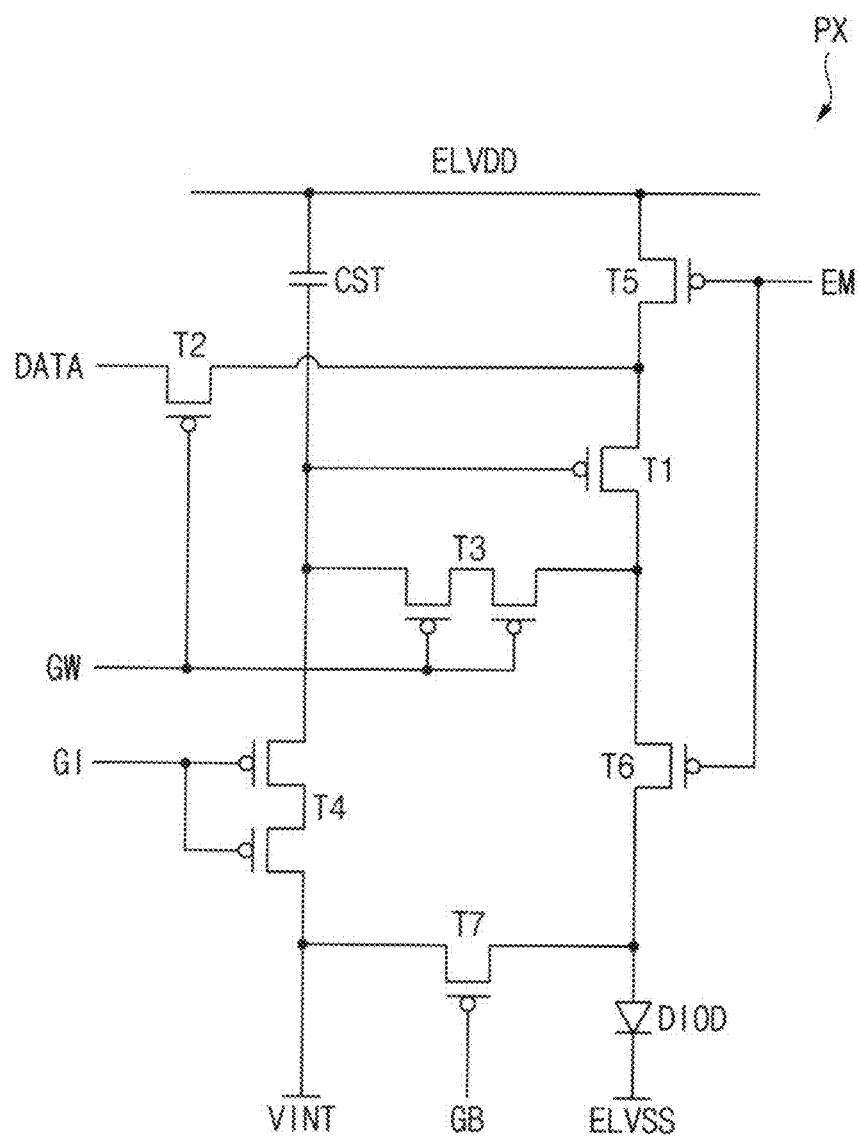
FIG. 2 is a circuit diagram illustrating a pixel included in the display device of FIG. 1.

FIG. 2 is a circuit diagram illustrating a pixel included in the display device of FIG. 1.

Referring to FIG. 2, in an embodiment, the pixel PX may include a first transistor T1, a second transistor T2, a third transistor T3, a fourth transistor T4, a fifth transistor T5, a sixth transistor T6, a seventh transistor T7, a storage capacitor CST, and a light emitting diode DIOD, but the invention is not limited thereto. In an alternative embodiment, for example, the pixel PX may include eight transistors and two capacitors.

The first transistor T1 may be electrically connected to the first power voltage line ELVED and an anode electrode of the light emitting diode DIOD, and may provide a driving current corresponding to the data signal provided by the data line DATA to the light emitting diode DIOD. The first transistor T1 may be referred to as a driving transistor.

The second transistor T2 may be connected to the data line DATA and a source electrode of the first transistor T1, and may transmit the data signal to the first transistor T1 in response to a scan signal provide by a scan line GW. The second transistor T2 may be referred to as a switching transistor.

The third transistor T3 may be connected to a gate electrode of the first transistor T1 and a drain electrode of the first transistor T1, and may compensate a threshold voltage of the first transistor T1 by diode-connecting the first transistor T1 in response to the scan signal. The third transistor T3 may be referred to as a compensation transistor.

In an embodiment, the third transistor T3 may be a dual-transistor including a first compensation transistor and a second compensation transistor.

The fourth transistor T4 may be connected to a initialization voltage line VINT and the gate electrode of the first transistor T1, and may transmit a initialization voltage to the gate electrode of the first transistor T1 in response to a first initialization control signal provided by a first initialization control line GI. The fourth transistor T4 may be referred to as a driving initialization transistor.

In an embodiment, the fourth transistor T4 may be a dual-transistor including a first initialization transistor and a second initialization transistor.

The fifth transistor T5 may be connected to the first power voltage line ELVDD and the source electrode of the first transistor T1, and the sixth transistor may be connected to the drain electrode of the first transistor T1 and the anode electrode of the light emitting diode DIOD. Each of the fifth transistor T5 and the sixth transistor T6 may provide the driving current to the anode electrode of the light emitting diode DIOD in response to an emitting control signal provided by an emitting control line EM. Each of the fifth transistor T5 and the sixth transistor T6 may be an emitting control transistor.

The seventh transistor T7 may be connected to the initialization voltage line VINT and the anode electrode of the light emitting diode DIOD, and may provide the initialization voltage to the anode electrode of the light emitting diode DIOD in response to a second initialization control signal provided by a second initialization control line GB. The seventh transistor T7 may be referred to as a diode initialization transistor.

The storage capacitor CST may be connected to the first power voltage line ELVDD and the gate electrode of the first transistor T1. In an embodiment, a first electrode of the storage capacitor may be the gate electrode of the first transistor T1, and a second electrode of the storage capacitor may be connected to the first power voltage line ELVDD. The storage capacitor CST may maintain a voltage between the first power voltage line ELVDD and the gate electrode of the first transistor T1.

The light emitting diode DIOD may be connected to a drain electrode of the sixth transistor T6 and a second power voltage line ELVSS. The light emitting diode DIOD may emit light based on the driving current.

FIG. 3, FIG. 4, FIG. 5, FIG. 6, and FIG. 7 are diagrams illustrating the pixel PX included in the display device 1000 of FIG. 1. Particularly, FIG. 3, FIG. 4, FIG. 5, FIG. 6, and FIG. 7 are plan views showing layers included in the pixel PX.

Figure 3:
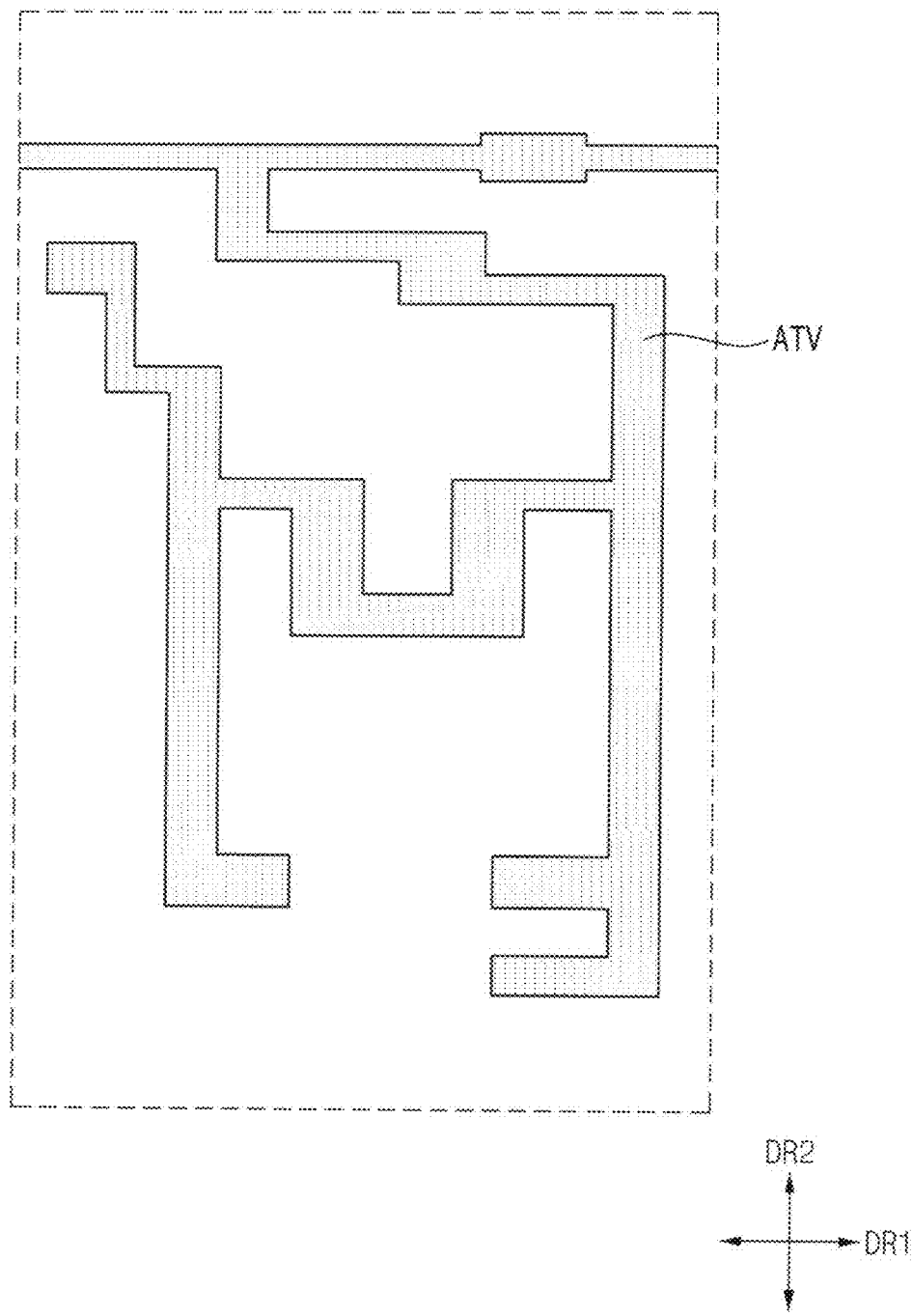
FIG. 3, FIG. 4, FIG. 5, FIG. 6, FIG. 7, FIG. 8, and FIG. 9 are diagrams illustrating the pixel included in the display device of FIG. 1.

Referring to FIG. 3, the pixel PX may include an active layer ATV. The active layer ATV may include a semiconductor material. In an embodiment, the semiconductor material may include a silicon semiconductor material. In an alternative embodiment, the semiconductor material may include an oxide semiconductor material.

Figure 4:
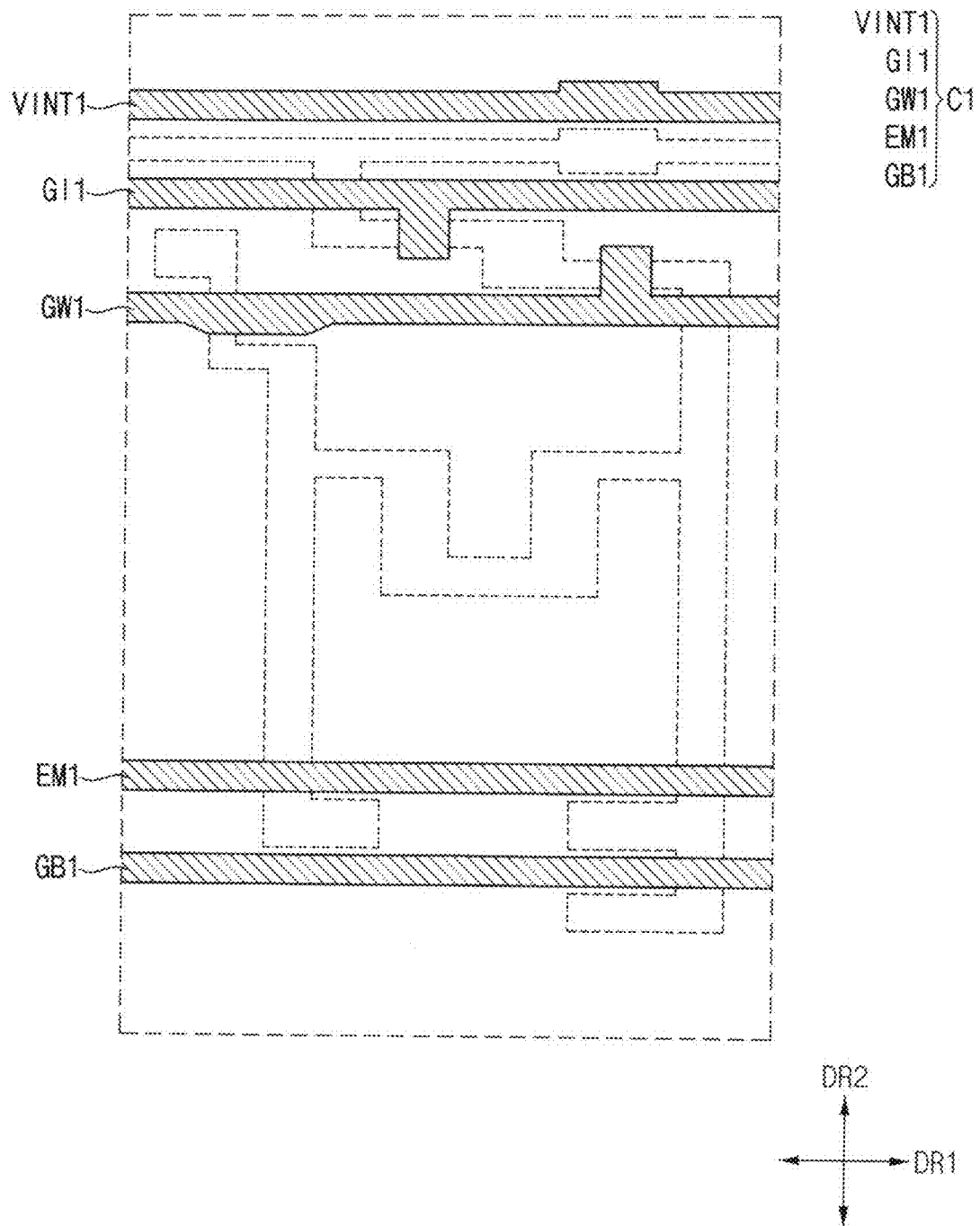

Referring to FIG. 4, the pixel PX may include a first conductive layer C1 disposed on the active layer ATV. The first conductive layer C1 may include a plurality of wires. In an embodiment, the first conductive layer C1 may include a lower initialization voltage line VINT1, a first lower initialization control line GI1, a lower scan line GW1, a lower emitting control line EM1, and a second lower initialization control line GB1. The first conductive layer C1 may include a conductive material C1. In an embodiment, for example, the first conductive material C1 may have a double-layer structure including a first metal layer including titanium and a second metal layer disposed on the first metal layer and including aluminum.

Figure 5:
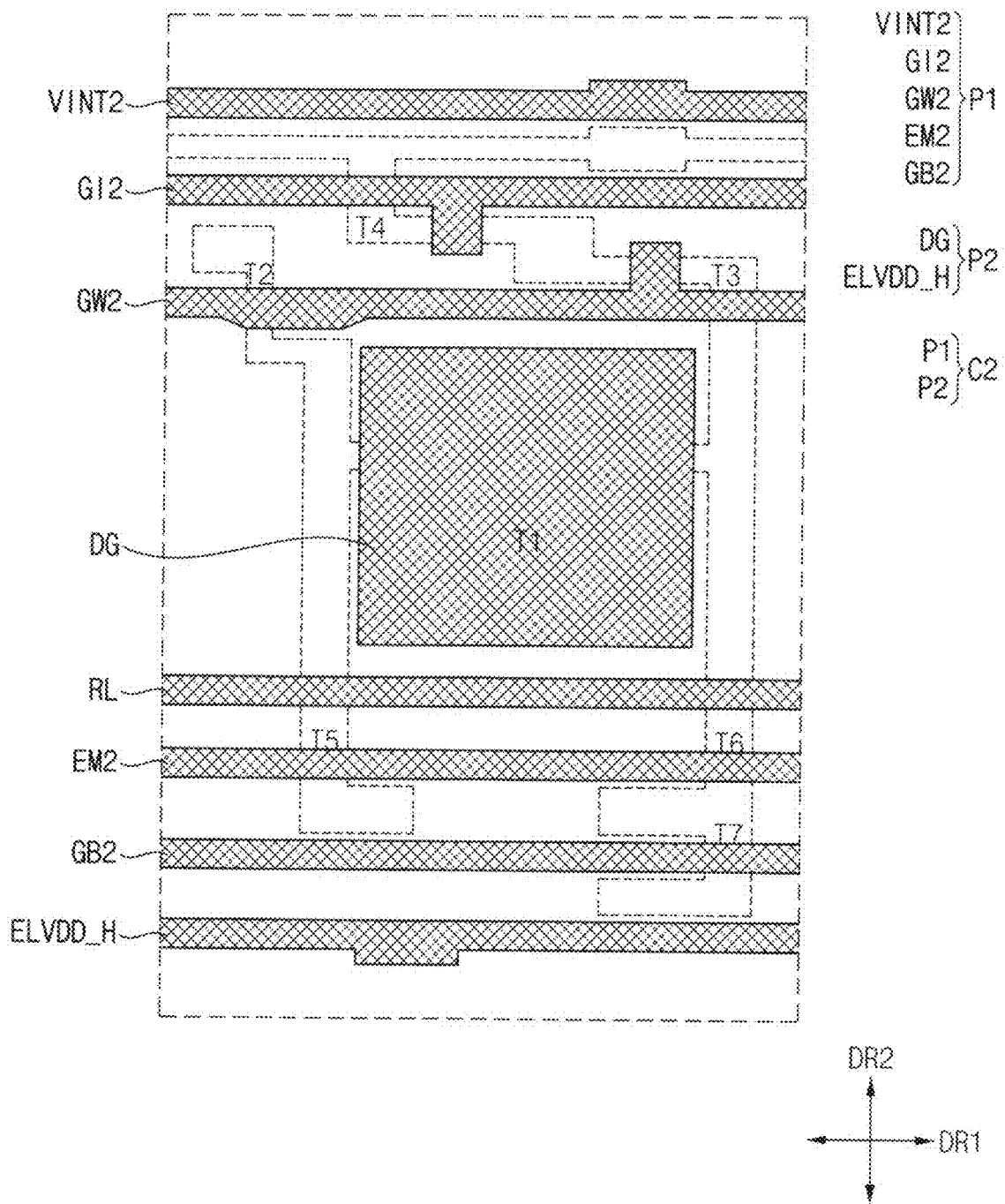

Referring to FIG. 5, the pixel PX may include a second conductive layer C2 disposed on the active layer ATV. The second conductive layer C2 may include a first pattern P1 and a second pattern P2. The second conductive layer C2 may include a conductive material. In an embodiment, for example, the second conductive layer C2 may have a single-layer structure including molybdenum.

The first pattern P1 may cover the plurality of wires. In an embodiment, for example, the first pattern P1 may directly contact an upper surface and a side surface of the plurality of wires.

In an embodiment, the first pattern P1 may include an upper initialization voltage line VINT2, a first upper initialization control line GI2, an upper scan line GW2, an upper emitting control line EM2, and a second upper initialization control line GB2.

The first upper initialization control line GI2 may cover the first lower initialization control line GI1. The first upper initialization control line GI2 and the first lower initialization control line GI1 may define the first initialization control line GI. At least a portion of the first initialization control line GI may overlap the active layer ATV, and the portion of the first initialization control line GI and the active layer ATV may define the fourth transistor T4.

The upper scan line GW2 may cover the lower scan line GW1. The lower scan line GW1 and the upper scan line GW2 may define the scan line GW. At least a portion of the scan line GW may overlap the active layer ATV, and the portion of the scan line GW and the active layer ATV may define the second transistor T2 and the third transistor T3.

The upper emitting control line EM2 may cover the lower emitting control line EM1. The lower emitting control line EM1 and the upper emitting control line EM2 may define the emitting control line EM. At least a portion of the emitting line EM may overlap the active layer ATV, and the portion of the emitting line EM and the active layer ATV may define the fifth transistor T5 and the sixth transistor T6.

The second upper initialization control line GB2 may cover the second lower initialization control line GB1. The second lower initialization control line GB1 and the second upper initialization control line GB2 may define the second initialization control line GB. At least a portion of the second initialization control line GB may overlap the active layer ATV, and the portion of the second initialization control line GB and the active layer ATV may define the seventh transistor T7.

The upper initialization voltage line VINT2 may cover the lower initialization voltage line VINT1. The lower initialization voltage line VINT1 and the upper initialization voltage line VINT2 may define the initialization voltage line VINT.

The second pattern P2 may be spaced apart from the first pattern P1 and the first conductive layer C1. In an embodiment, the second pattern P2 may be disposed in or directly on a same layer as the first conductive layer C1. In an embodiment, for example, the second pattern P2 and the first conductive layer C1 may be disposed on a upper surface of a first insulation layer (IL1 of FIG. 9).

In an embodiment, the second pattern P2 may include a first horizontal power voltage line ELVDD_H and a driving gate electrode DG. The first horizontal power voltage line ELVDD_H may extend in the first direction DR1. At least a portion of the driving gate electrode DG may overlap the active layer ATV, and the portion of the driving gate electrode DG and the active layer ATV may define the first transistor T1. In such an embodiment, the driving gate electrode DG may be the gate electrode of the first transistor T1.

In an embodiment, the pixel PX may include a repair line RL. The repair line RL may extend in the first direction DR1. The repair line RL may be electrically insulated from the active layer ATV, the first conductive layer C1, and the second conductive layer C2. In such an embodiment, the repair line RL may be electrically insulated from a third conductive layer (C3 of FIG. 6). When a short-circuit occurs in the first conductive layer C1, the second conductive layer C2, or the third conductive layer C3, a short-circuited portion and the repair line RL may be electrically connected to each other.

In an embodiment, the repair line RL may be disposed on the same layer as the first conductive layer C1. In an embodiment, for example, the repair line RL and the first conductive layer C1 may be disposed on the upper surface of the first insulation layer (IL1 of FIG. 9).

In an embodiment, the repair line RL may include a same material as the second conductive layer C2. In such an embodiment, the repair line RL may be formed simultaneously with the second conductive layer C2.

Figure 6:
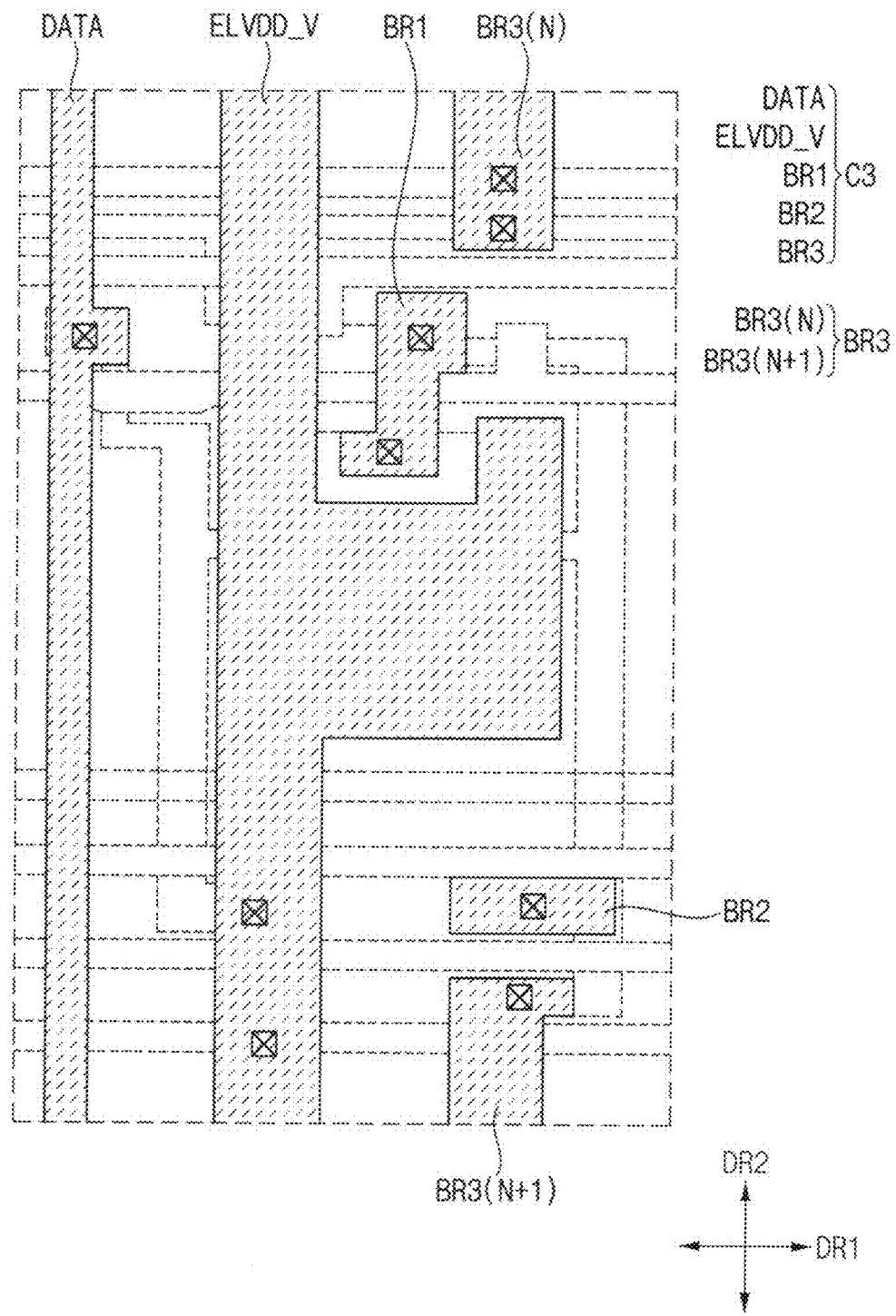

Referring to FIG. 6, the pixel PX may include the third conductive layer C3 disposed on the second conductive layer C2. At least a portion of the third conductive layer C2 may electrically contact the second pattern P2.

In an embodiment, the third conductive layer C3 may include the data line DATA, a first vertical power voltage line ELVDD_V, a first bridge electrode BR1, a second bridge electrode BR2, and a third bridge electrode BR3.

The data line DATA may electrically contact the active layer ATV. In an embodiment, for example, the data line DATA may electrically contact a source electrode of the second transistor T2.

The first vertical power voltage line ELVDD_V may electrically contact the active layer ATV. In an embodiment, for example, the first vertical power voltage line ELVDD_V may electrically contact a source electrode of the fifth transistor T5.

The first vertical power voltage line ELVDD_V may electrically contact the first horizontal power voltage line ELVDD_H. The first horizontal power voltage line ELVDD_H and the first vertical power voltage line ELVDD_V may define the first power voltage line ELVDD.

The first horizontal voltage line ELVDD_H may extend in the first direction DR1, and the first vertical voltage line ELVDD_V may extend in the second direction DR2. Accordingly, the first voltage line ELVDD may be arranged in a mesh form in the display area DA.

At least a portion of the first vertical power voltage line ELVDD_V may overlap the driving gate electrode DG. Accordingly, the portion of the first vertical power voltage line ELVDD_V and the driving gate electrode DG may define the storage capacitor CST.

The first bridge electrode BR1 may electrically contact the active layer ATV and the driving gate electrode DG. In an embodiment, for example, the first bridge electrode BR1 may electrically contact a drain electrode of the third transistor T3, a drain electrode of the fourth transistor, and the driving gate electrode DG.

The second bridge electrode BR2 may electrically contact the active layer ATV. In an embodiment, for example, the second bridge electrode BR2 may electrically contact a drain electrode of the sixth transistor T6.

The third bridge electrode BR3 may include a $N^{th}$ bridge electrode BR3(N) and a $(N+1)^{th}$ bridge electrode BR3(N+1). Here, N is a natural number. In an embodiment where the pixels PX are arranged in a matrix form in the first direction DR1 and the second direction DR2, the pixel PX in a $N^{th}$ row may include the $N^{th}$ bridge electrode BR3(N), and the pixel PX in a $(N+1)^{th}$ row may include the $(N+1)^{th}$ bridge electrode BR3(N+1).

The $N^{th}$ bridge electrode BR3(N) may electrically contact the upper initialization voltage line VINT2 included in the pixel PX in the $N^{th}$ row, a source electrode of the fourth transistor T4 included in the pixel PX in the $N^{th}$ row, and a source electrode of the seventh transistor T7 included in the pixel in a $(N-1)^{th}$ row, and the $(N+1)^{th}$ bridge electrode BR3(N+1) may electrically contact a source electrode of the seventh transistor T7 included in the pixel PX in the $N^{th}$ row, the upper initialization voltage line VINT2 included in the pixel in the $(N+1)^{th}$ row, and a source electrode of the fourth transistor T4 included in the pixel in the $(N+1)^{th}$ row.

Figure 7:
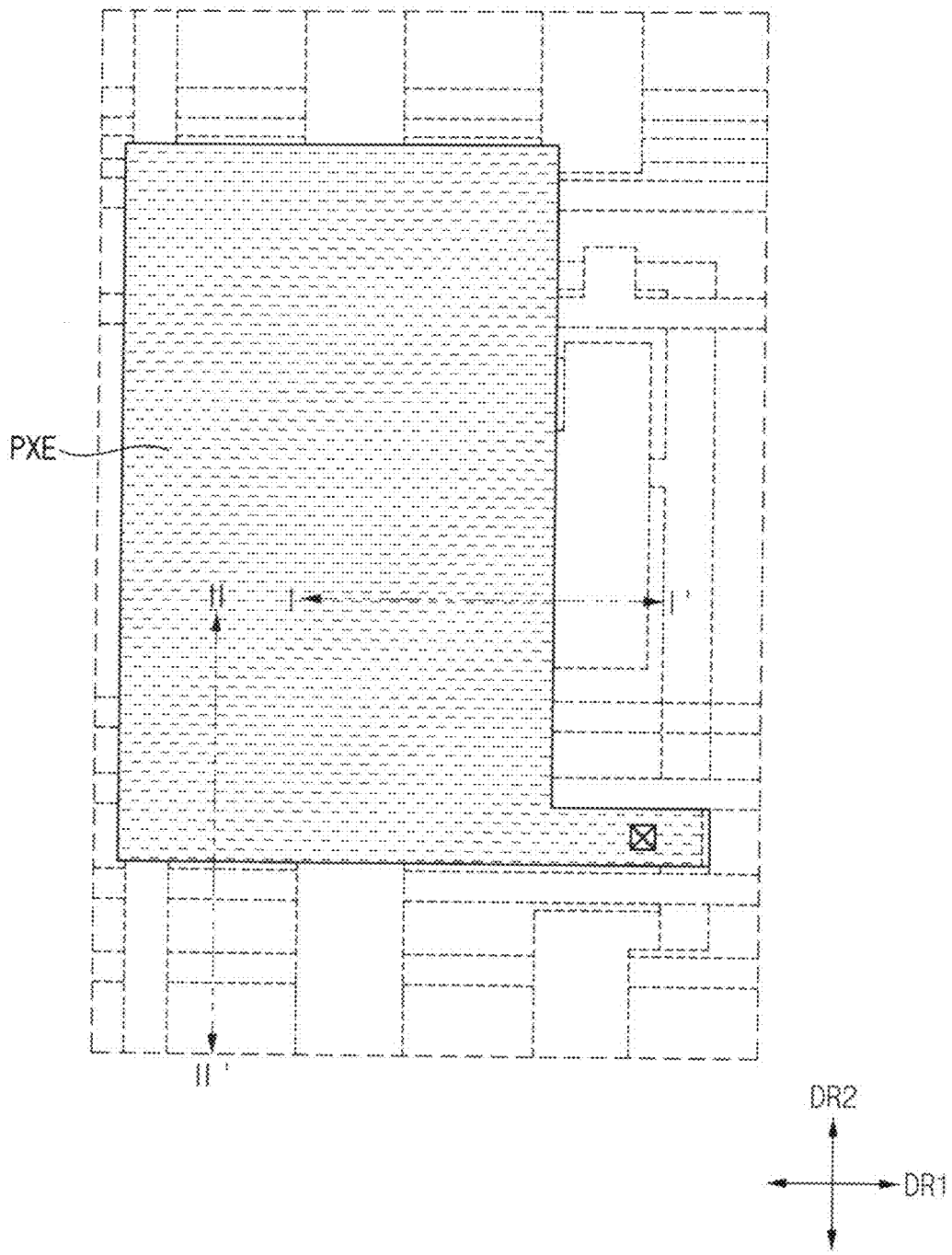

Referring to FIG. 7, the pixel PX may include a pixel electrode PXE disposed on the third conductive layer C3. The pixel electrode PXE may be electrically connected to the third conductive layer C3. In an embodiment, for example, the pixel electrode PXE may electrically contact the second bridge electrode BR2.

Figure 8:
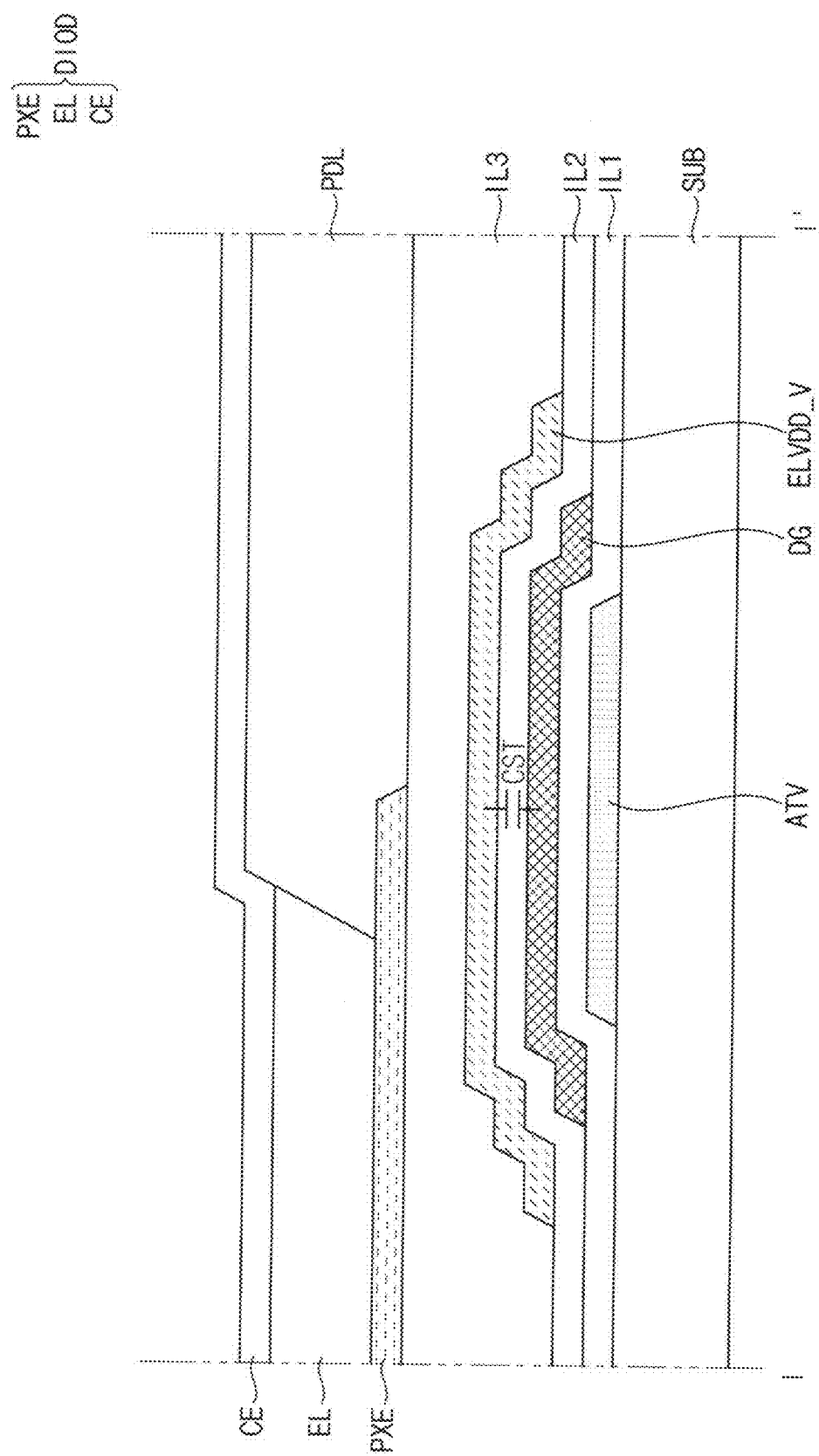

FIG. 8 is a cross-sectional view taken along line I-T of FIG. 7.

Referring to FIG. 8, in an embodiment, the pixel PX may include a substrate SUB, the active layer ATV, the first insulation layer IL1, the driving gate electrode DG, a second insulation layer IL2, the first vertical power voltage line ELVDD_V, a third insulation layer IL3, the pixel electrode PXE, a pixel defining layer PDL, a light emitting layer EL, and a common electrode CE. The driving gate electrode DG and the first vertical power voltage line ELVDD_V may define the storage capacitor CST, and the pixel electrode PXE, the light emitting layer EL, and the common electrode CE may define the light emitting diode DIOD.

The substrate SUB may include glass or plastic. In an embodiment, the substrate SUB may have flexibility.

The active layer ATV and the first insulation layer IL1 may be disposed on the substrate SUB, and the first insulation layer IL1 may cover the active layer ATV. The first insulation layer IL1 may include an inorganic insulation material.

The driving gate electrode DG and the second insulation layer IL2 may be disposed on the first insulation layer IL1, and the second insulation layer IL2 may cover the driving gate electrode DG. The second insulation layer IL2 may include an inorganic insulation material.

The first vertical power voltage line ELVDD_V and the third insulation layer IL3 may be disposed on the second insulation layer IL2, and the third insulation layer IL3 may cover the first vertical power voltage line ELVDD_V. The third insulation layer IL3 may include an organic insulation material. An upper surface of the third insulation layer IL3 may be substantially flat.

The pixel electrode PXE and the pixel defining layer PDL may be disposed on the third insulation layer IL3. The pixel defining layer PDL may be disposed on the pixel electrode PXE to cover a portion of the pixel electrode PXE. An opening may be defined in the pixel defining layer PDL to expose at least a portion of the pixel electrode PXE.

The light emitting layer EL may be disposed on the pixel electrode PXE in the opening. The light emitting layer EL may emit light. In an embodiment, the light emitting layer EL may include an organic light emitting material.

The common electrode CE may cover the light emitting layer EL and the pixel defining layer PDL. The common electrode CE may include a transparent conductive material.

Figure 9:
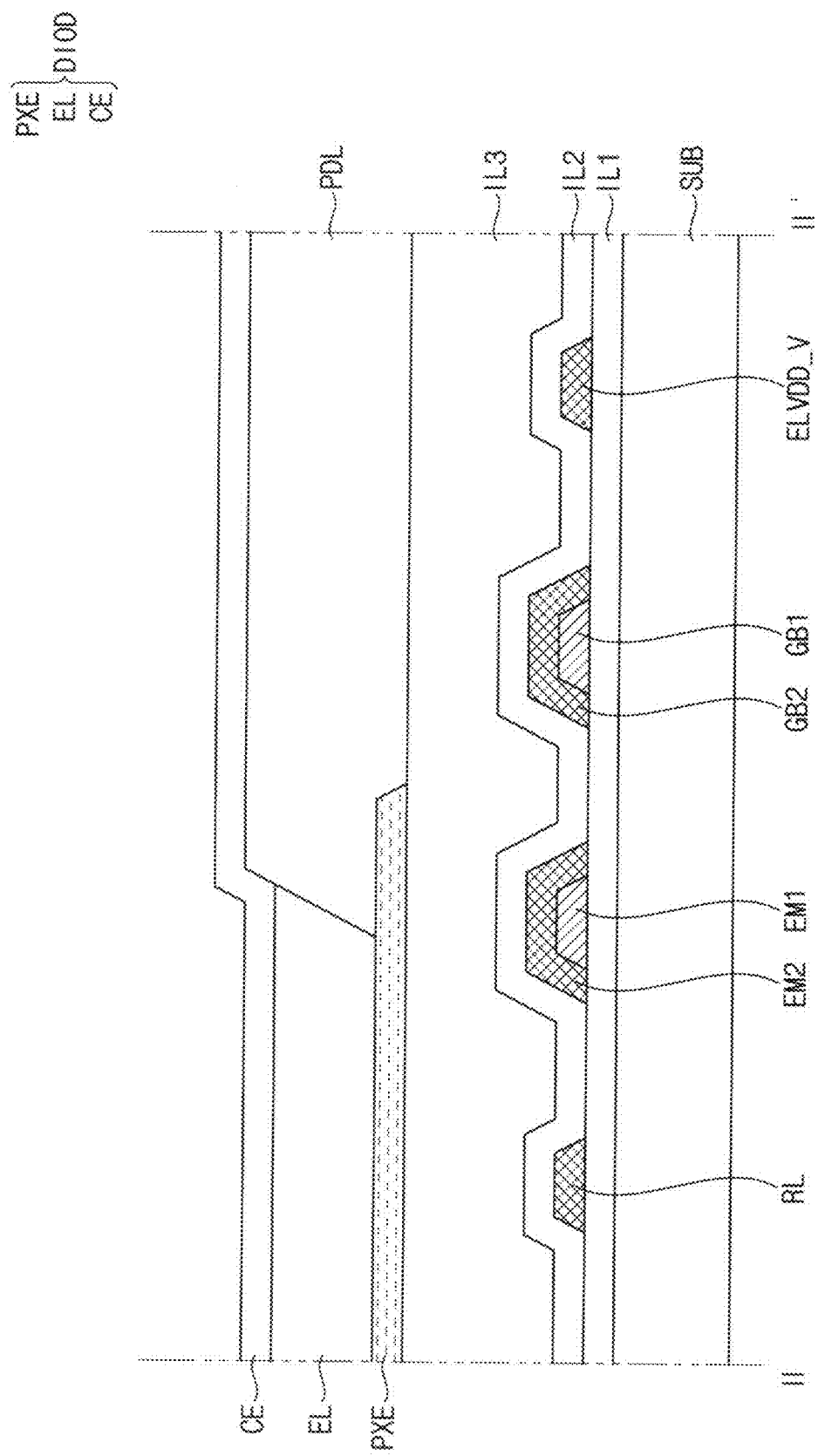

FIG. 9 is a cross-sectional view taken along line II-II' of FIG. 7.

Referring to FIG. 9, in an embodiment, the pixel PX may include the substrate SUB, the first insulation layer IL1, the repair line RL, the lower emitting control line EM1, the upper emitting control line EM2, the second lower initialization control line GB1, the second upper initialization control line GB2, the first horizontal power voltage line ELVDD_H, the second insulation layer IL2, the third insulation layer IL3, the pixel electrode PXE, the pixel defining layer PDL, the light emitting layer EL, and the common electrode CE.

The repair electrode RL and the first horizontal power voltage line ELVDD_H may be disposed in or directly on a same layer as the lower emitting control line EM1 and the second lower initialization control line GB1. In an embodiment, for example, the repair line RL, the first horizontal power voltage line ELVDD_H, the lower emitting control line EM1, and the second lower initialization control line GB1 may be disposed on the first insulation layer IL1.

The upper emitting control line EM2 may cover the lower emitting control line EM1. In an embodiment, the upper emitting control line EM2 may cover an upper surface and a side surface of the lower emitting control line EM1.

The second upper initialization control line GB2 may cover the second lower initialization control line GB1. In an embodiment, the second upper initialization control line GB2 may cover an upper surface and a side surface of the second lower initialization control line GB1.

The repair line RL, the first horizontal power voltage line ELVDD_H, the upper emitting control line EM2, and the upper initialization control line GB2 may be formed substantially simultaneously in a same process.

Figure 10:
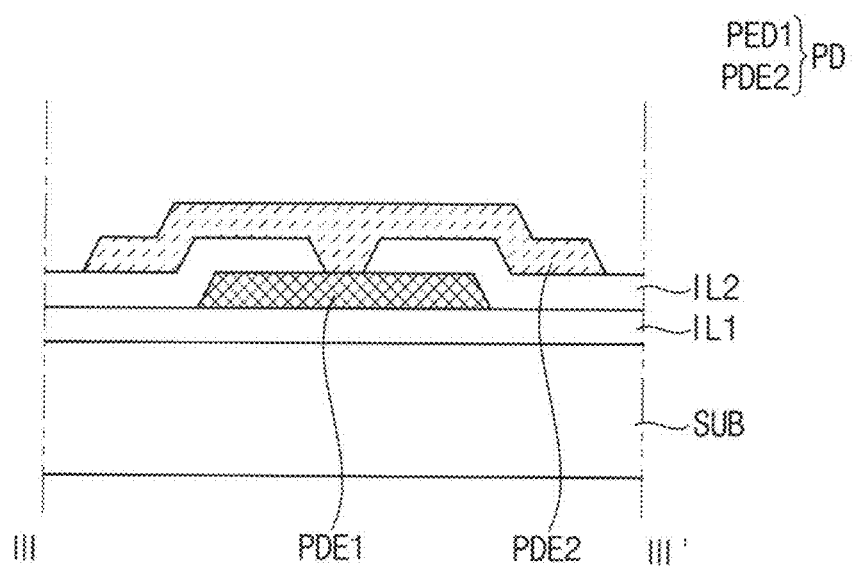
FIG. 10 is a cross-sectional view illustrating a pad included in the display device of FIG. 1.

FIG. 10 is a cross-sectional view illustrating the pad PD included in the display device 1000 of FIG. 1. Particularly, FIG. 10 is a cross-sectional view taken along line III-III' of FIG. 1.

Referring to FIG. 10, in an embodiment, the second pattern P2 may include a first pad electrode PDE1, and the third conductive layer C3 may include a second pad electrode PDE2. The first pad electrode PDE1 and the second pad electrode PDE2 may define the pad PD.

The first pad electrode PDE1 may be disposed on the first insulation layer IL1. The second insulation layer IL2 may cover the first pad electrode PDE1.

The second pad electrode PDE2 may be disposed on the second insulation layer IL2. The second pad electrode PDE2 may electrically contact the first pad electrode PDE1. In an embodiment, for example, the second pad electrode PDE2 may electrically contact the first pad electrode PDE1 through a through hole defined in the first insulation layer IL1.

Figure 11:
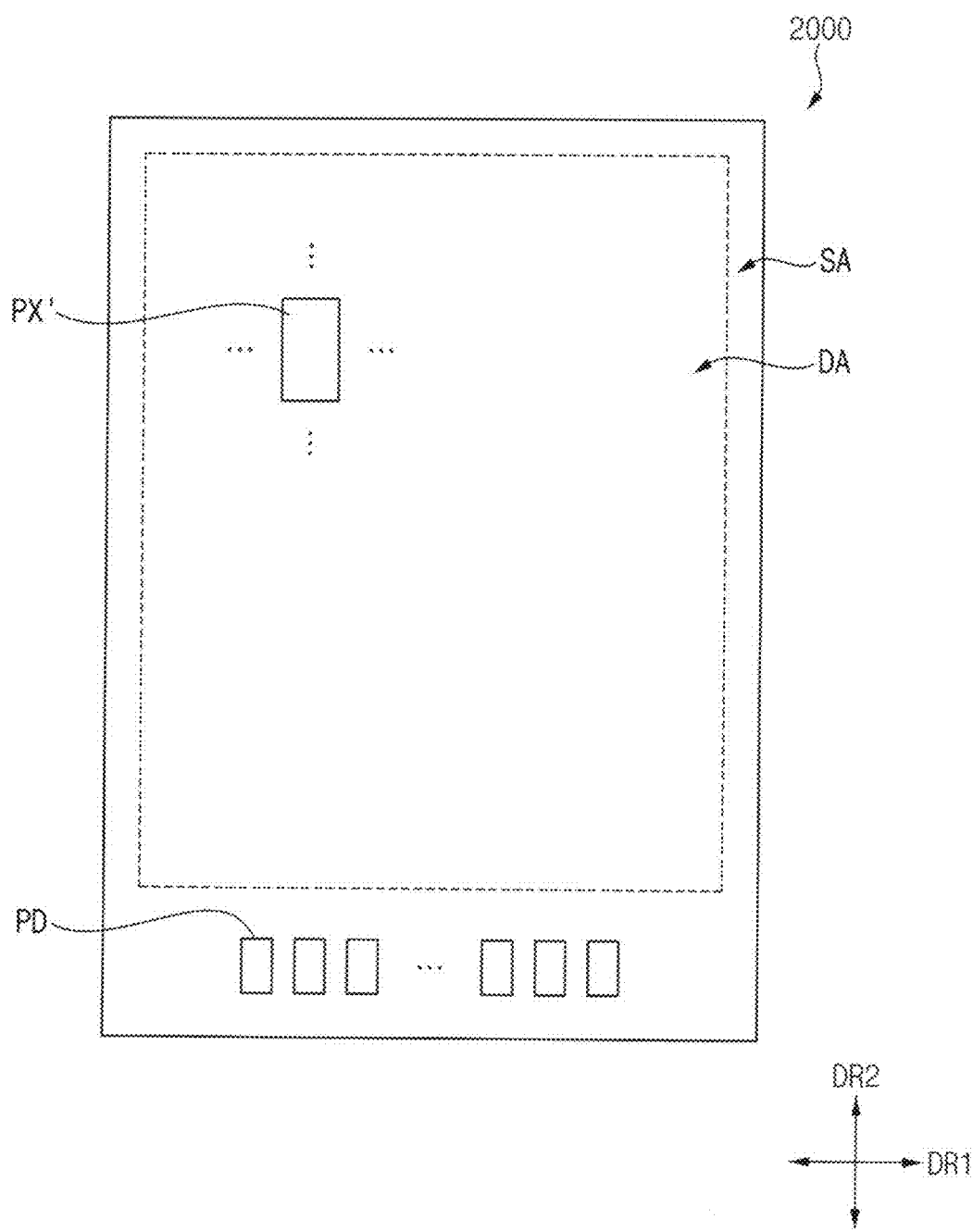
FIG. 11 is a plan view illustrating a display device according to an alternative embodiment.
Figure 12:
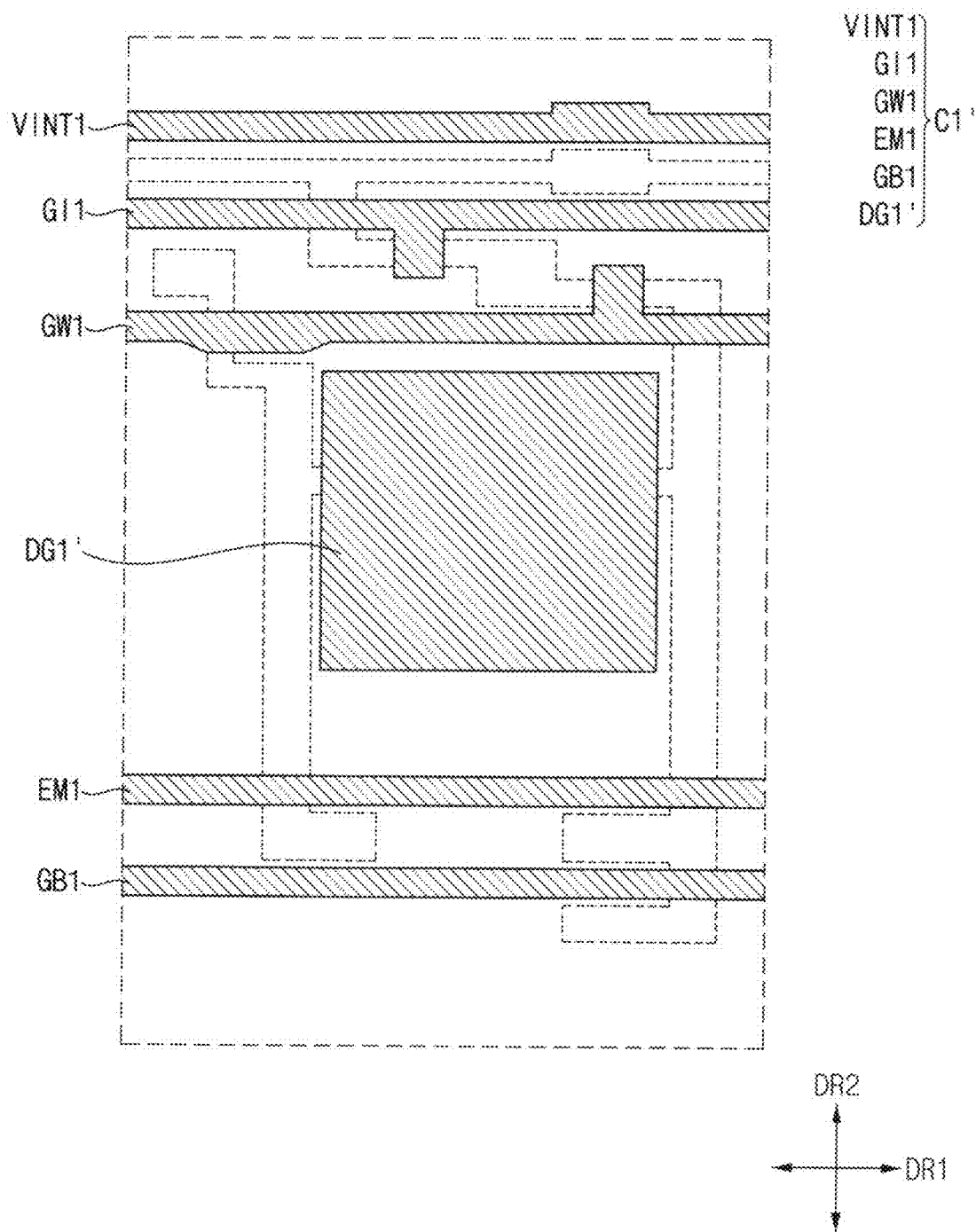
FIG. 12, FIG. 13, and FIG. 14 are diagrams illustrating a pixel included in the display device of FIG. 11.
Figure 13:
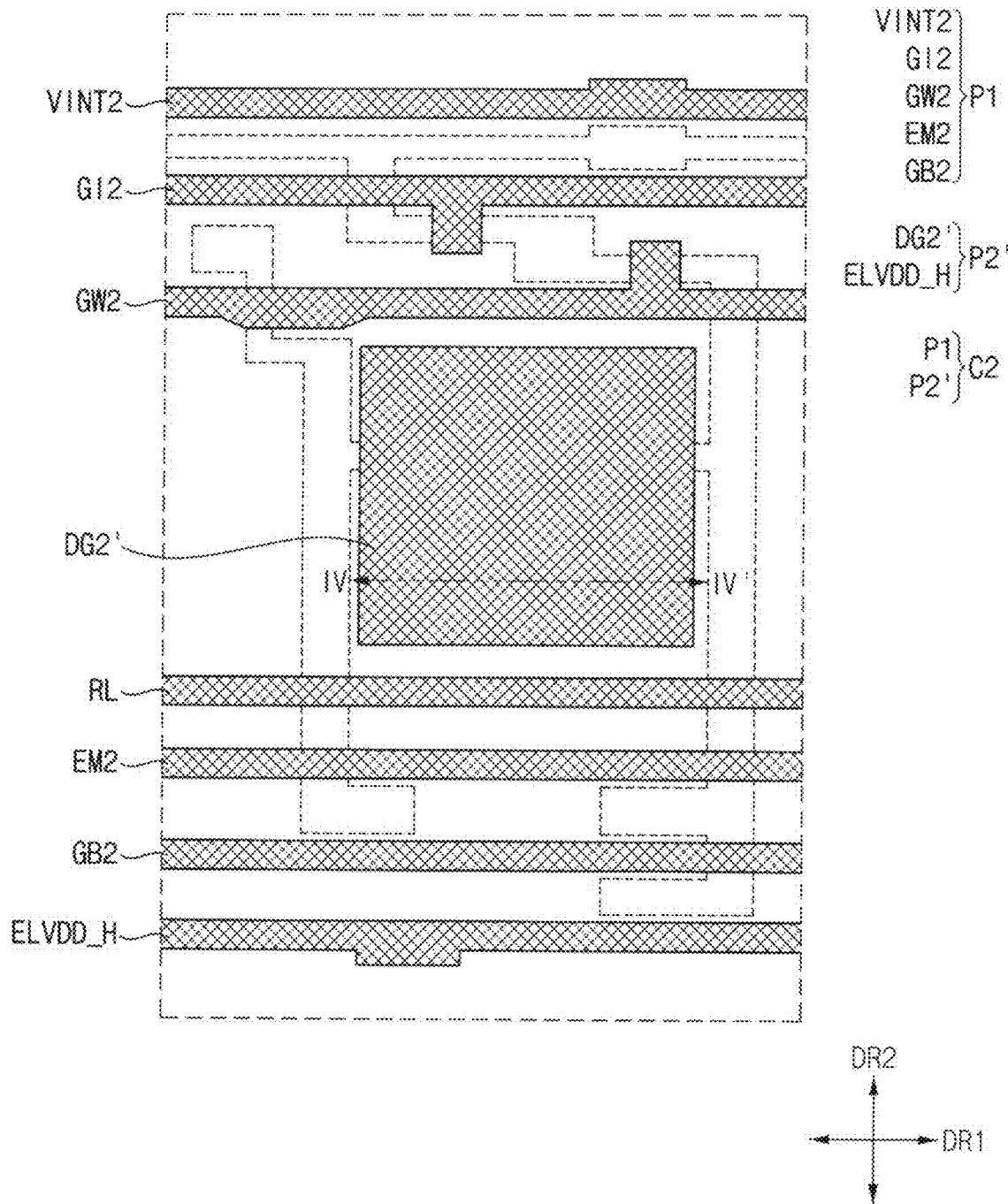
Figure 14:
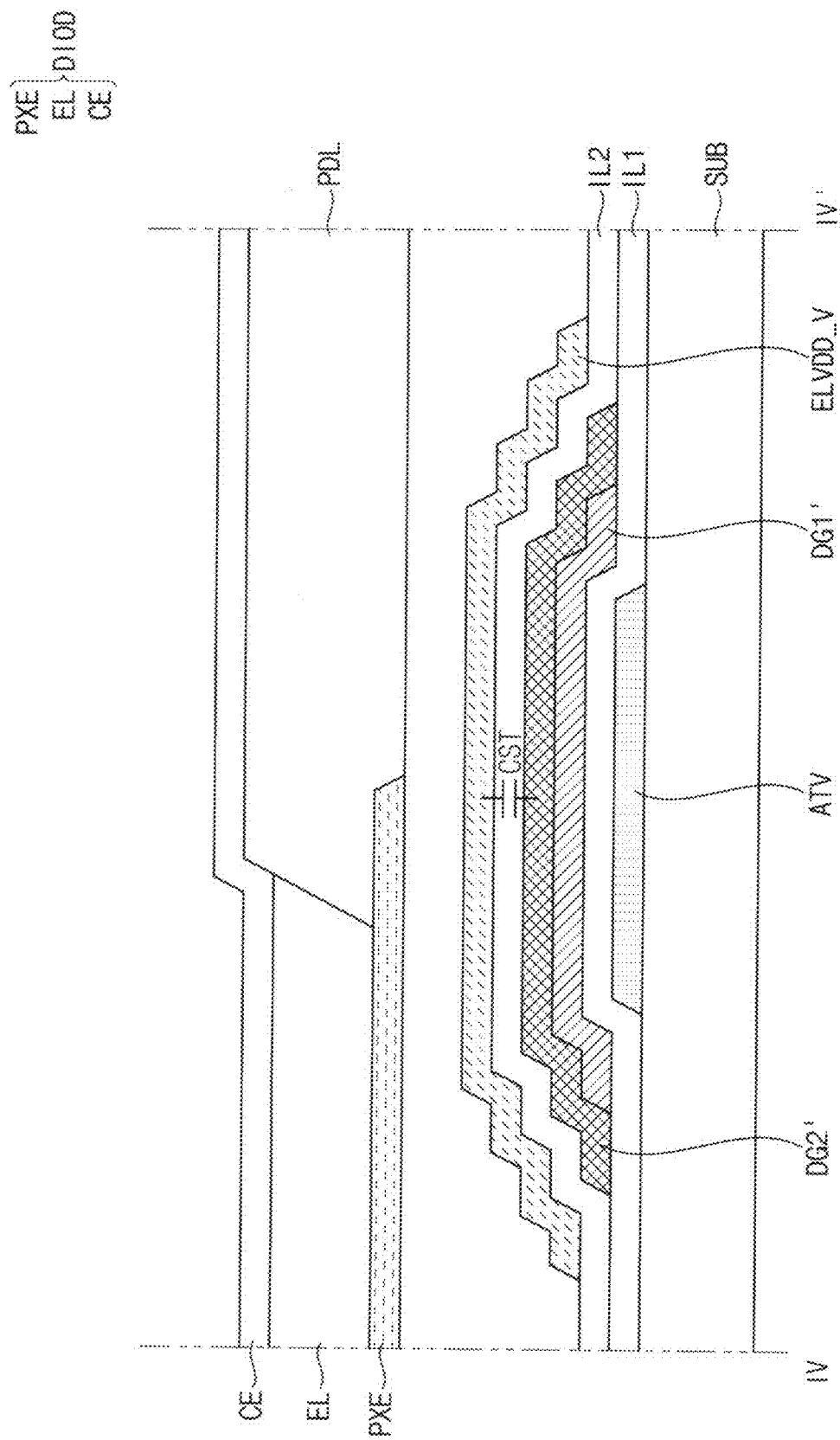

FIG. 11 is a plan view illustrating a display device according to an alternative embodiment. FIG. 12, FIG. 13, and FIG. 14 are diagrams illustrating a pixel included in the display device of FIG. 11

Referring to FIG. 11, in an embodiment, a display device 2000 may include a pixel PX'. The display device 2000 shown in FIG. 11 may be substantially same as the display device 1000 shown in FIG. 1, except for the pixel PX'. The same or like elements shown in FIG. 11 to FIG. 14 have been labeled with the same reference characters as used above to describe the embodiments described above with reference to FIG. 1 to FIG. 10, and any repetitive detailed description thereof will hereinafter be omitted or simplified.

FIG. 12 and FIG. 13 are diagrams illustrating the pixel PX' included in the display device 2000 of FIG. 11.

Referring to FIG. 12, the pixel PX' may include a first conductive layer C1' disposed on the active layer ATV. The first conductive layer C1' may include a plurality of wires.

In an embodiment, the first conductive layer C1' may include the lower initialization voltage line VINT1, the first lower initialization control line GI1, the lower scan line GW1, the lower emitting control line EM1, the second lower initialization control line GB1, and a first driving gate electrode DG1.

Referring to FIG. 13, the pixel PX' may include a second conductive layer C2' disposed on the active layer ATV. The second conductive layer C2' may include the first pattern P1 and a second pattern P2.

The second pattern P2 may include a second driving gate electrode DG2 and the first horizontal power voltage line ELVDD_H.

The second driving gate electrode DG2' may cover the first driving gate electrode DG1'. The first driving gate electrode DG1' and the second driving gate electrode DG2' may define the gate electrode of the first transistor T1.

FIG. 14 is a cross-sectional view taken along line IV-IV of FIG. 13.

Referring to FIG. 13, the pixel PX' may include the substrate SUB, the active layer ATV, the first insulation layer IL1, the first driving gate electrode DG1, the second driving gate electrode DG2, the second insulation layer IL2, the first vertical power voltage line ELVDD_V, the third insulation layer IL3, the pixel electrode PXE, the pixel defining layer PDL, the light emitting layer EL, and the common electrode CE. The pixel electrode PXE, the light emitting layer EL, and the common electrode CE may define the light emitting diode DIOD.

The first driving gate electrode DG1' may be disposed on the first insulation layer IL1, and the second driving gate electrode DG2 may cover an upper surface and a side surface of the first driving gate electrode DG1'. The second insulation layer IL2 may cover the second driving gate electrode DG2 covering the first driving gate electrode DG1'.

At least a portion of the first vertical power voltage line EVDD_V may overlap the second driving gate electrode DG2'. Accordingly, the second driving gate electrode DG2' and the first vertical power line ELVDD_V may define the storage capacitor CST.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a base substrate;
    an active layer disposed on the base substrate;
    a first conductive layer disposed on the active layer, wherein the first conductive layer comprises a plurality of wires;
    a second conductive layer disposed on the active layer, wherein the second conductive layer comprises a first pattern covering each of the plurality of wires and a second pattern spaced apart from the first pattern; and
    a third conductive layer disposed on the second conductive layer, wherein at least a portion of the third conductive layer electrically contacts the second pattern,
    wherein the second pattern further comprises a first pad electrode, and the third conductive layer further comprises a second pad electrode disposed on the first pad electrode and electrically contacting the first pad electrode.

2. The display device of claim 1, wherein the first pattern directly contacts an upper surface and a side surface of each of the plurality of wires.

3. The display device of claim 1, wherein the second pattern comprises a horizontal signal line extending in a first direction.

4. The display device of claim 3, wherein the third conductive layer comprises a vertical signal line extending in a second direction crossing the first direction, and electrically contacting the horizontal signal line.

5. The display device of claim 4, wherein
    the second pattern further comprises a driving gate electrode,
    wherein at least a portion of the driving gate electrode overlaps the active layer.

6. The display device of claim 5, wherein
    at least a portion of the vertical signal line overlaps the driving gate electrode, and
    the portion of the vertical signal line and the driving gate electrode define a capacitor.

7. The display device of claim 1, further comprising:
    a repair line extending in a first direction,
    wherein the repair line is electrically insulated from the active layer, the first conductive layer, the second conductive layer and the third conductive layer.

8. The display device of claim 7, wherein the repair line is disposed in a same layer as the first conductive layer.

9. The display device of claim 7, wherein the repair line comprises a same material as the second conductive layer.

10. The display device of claim 1, wherein the second pattern is disposed in a same layer as the first conductive layer.

11. The display device of claim 1, wherein
    the first conductive layer comprises:
        a first metal layer comprising titanium; and
        a second metal layer disposed on the first metal layer and comprising aluminum, and
    the second conductive layer comprises molybdenum.

12. The display device of claim 1, further comprising:
    a pixel electrode disposed on the third conductive layer and electrically contacting the third conductive layer; and
    a pixel defining layer disposed on the pixel electrode, wherein an opening is defined in the pixel defining layer to expose at least a portion of the pixel electrode.

13. A display device comprising:
    a base substrate;
    an active layer disposed on the base substrate;
    a first conductive layer disposed on the active layer, wherein the first conductive layer comprises a plurality of wires and a first driving gate electrode, wherein at least a portion of the first driving gate electrode overlaps the active layer;
    a second conductive layer disposed on the active layer, wherein the second conductive layer comprises a first pattern covering each of the plurality of wires, a second pattern spaced apart from the first pattern, and a second driving gate electrode covering the first driving gate electrode; and
    a third conductive layer disposed on the second conductive layer, wherein at least a portion of the third conductive layer electrically contacts the second pattern,
    wherein the second pattern further comprises a first pad electrode, and the third conductive layer further comprises a second pad electrode disposed on the first pad electrode and electrically contacting the first pad electrode.

14. The display device of claim 13, wherein the second pattern comprises a horizontal signal line extending in a first direction.

15. The display device of claim 14, wherein the third conductive layer comprises a vertical signal line extending in a second direction crossing the first direction and electrically contacting the horizontal signal line.

16. The display device of claim 15, wherein
    at least a portion of the vertical signal line overlaps the second driving gate electrode, and
    the portion of the vertical signal line and the driving gate electrode define a capacitor.

17. The display device of claim 13, further comprising:
    a repair line extending in a first direction,
    wherein the repair line is electrically insulated from the active layer, the first conductive layer, the second conductive layer and the third conductive layer.

18. The display device of claim 17, wherein the repair line is disposed in a same layer as the first conductive layer.

19. The display device of claim 17, wherein the repair line comprises a same material as the second conductive layer.

* * * * *